United States Patent
Ding et al.

(10) Patent No.: US 12,068,655 B2
(45) Date of Patent: Aug. 20, 2024

(54) DISPLACEMENT DEVICE BASED ON HALL-EFFECT SENSORS AND PLANAR MOTORS

(71) Applicant: SHANGHAI YINGUAN SEMICONDUCTOR TECHNOLOGY CO., LTD, Shanghai (CN)

(72) Inventors: Chenyang Ding, Shanghai (CN); Hanxiong Li, Shanghai (CN); Guoqi Zhang, Shanghai (CN); Chunyuan Chen, Shanghai (CN); Xiaohui Wu, Shanghai (CN)

(73) Assignee: Shanghai Yinguan Semiconductor Technology Co., Ltd., Shanghai (CN)

( * ) Notice: Subject to any disclaimer, the term of this patent is extended or adjusted under 35 U.S.C. 154(b) by 373 days.

(21) Appl. No.: 17/425,831

(22) PCT Filed: Nov. 29, 2019

(86) PCT No.: PCT/CN2019/121897
§ 371 (c)(1),
(2) Date: Jul. 26, 2021

(87) PCT Pub. No.: WO2020/155829
PCT Pub. Date: Aug. 6, 2020

(65) Prior Publication Data
US 2022/0052585 A1    Feb. 17, 2022

(30) Foreign Application Priority Data
Jan. 29, 2019 (CN) .......................... 201910088055.5

(51) Int. Cl.
*H02K 41/00* (2006.01)
*H02K 11/215* (2016.01)
(Continued)

(52) U.S. Cl.
CPC ......... *H02K 41/031* (2013.01); *H02K 11/215* (2016.01); *H02K 41/00* (2013.01);
(Continued)

(58) Field of Classification Search
CPC ..... G03F 7/70758; G03F 7/20; H02K 11/215; H02K 41/031; H02K 2201/18; H02K 41/00; H02K 41/02; H02K 41/0356
(Continued)

(56) References Cited

U.S. PATENT DOCUMENTS

| | | | |
|---|---|---|---|
| 2005/0077786 A1 | 4/2005 | De Weerdt | |
| 2010/0090545 A1 | 4/2010 | Binnard et al. | |

(Continued)

FOREIGN PATENT DOCUMENTS

| | | |
|---|---|---|
| CN | 102722089 A | 10/2012 |
| CN | 103891114 A | 6/2014 |

(Continued)

OTHER PUBLICATIONS

English Translation of the Written Opinion of the International Searching Authority for PCT Application No. PCT/CN2019/121897; China National Intellectual Property Administration; Beijing, China; dated Feb. 21, 2020.
(Continued)

*Primary Examiner* — Alexander A Singh
(74) *Attorney, Agent, or Firm* — Thomas E. Lees, LLC

(57) ABSTRACT

The present invention discloses a displacement device based on Hall-effect sensors and planar motors. The device at least comprises a planar motor stator, a planar motor mover, and a Hall-effect sensor array, a magnet array on the planar motor stator extends on a first plane substantially parallel to a direction X and a direction Y to form a working area, a coil array on the planar motor mover is configured on a second plane parallel to the first plane, an interaction between the
(Continued)

coil array and the magnet array causes the planar motor mover to produce a displacement of at least two degrees of freedom within the working area, the magnet array is configured by first magnet blocks and second magnet blocks alternately in rows and columns, the Hall-effect sensor array is composed of a plurality of Hall-effect sensors, and installed on the planar motor mover, a size of the magnet blocks of the magnet array in the direction X is not less than twice a column spacing of the Hall-effect sensor array, and the size of the magnet blocks of the magnet array in the direction Y is not less than twice a row spacing of the Hall-effect sensor array.

10 Claims, 4 Drawing Sheets

(51) Int. Cl.
  *H02K 41/02* (2006.01)
  *H02K 41/03* (2006.01)
  *H02K 41/035* (2006.01)
  *G03F 7/00* (2006.01)
  *G03F 7/20* (2006.01)

(52) U.S. Cl.
  CPC ......... *H02K 41/02* (2013.01); *H02K 41/0356* (2013.01); *G03F 7/20* (2013.01); *G03F 7/70758* (2013.01); *H02K 2201/18* (2013.01)

(58) Field of Classification Search
  USPC .......... 310/12.01, 12.05, 12.24, 12.25, 12.26
  See application file for complete search history.

(56) References Cited

U.S. PATENT DOCUMENTS

| 2012/0074890 | A1* | 3/2012 | Coakley | G05B 19/401 |
| | | | | 318/653 |
| 2015/0326150 | A1* | 11/2015 | Zhu | H02N 15/00 |
| | | | | 269/8 |
| 2016/0161288 | A1* | 6/2016 | Lu | H01L 21/67259 |
| | | | | 324/207.2 |

FOREIGN PATENT DOCUMENTS

| CN | 103973172 A | 8/2014 |
| CN | 105452812 A | 3/2016 |
| CN | 107769512 A | 3/2018 |
| CN | 107949809 A | 4/2018 |
| CN | 108336884 A | 7/2018 |
| WO | 2017/005457 A1 | 1/2017 |

OTHER PUBLICATIONS

International Search Report for PCT Application No. PCT/CN2019/121897; China National Intellectual Property Administration; Beijing, China; dated Feb. 21, 2020.

Written Opinion of the International Searching Authority for PCT Application No. PCT/CN2019/121897; China National Intellectual Property Administration; Beijing, China; dated Feb. 21, 2020.

Chinese first Office action and search report for Chinese Patent Application No. 201910088055.5; China National Intellectual Property Administration; Beijing, China; dated Nov. 26, 2021.

* cited by examiner

DISPLACEMENT DEVICE BASED ON HALL-EFFECT SENSORS AND PLANAR MOTORS

CROSS-REFERENCE TO RELATED APPLICATIONS

This application is a national stage entry under 35 USC § 371(b) of PCT International Application No. PCT/CN2019/121897, filed on Nov. 29, 2019, and claims the benefit of Chinese Patent No. 201910088055.5, filed on Jan. 29, 2019, which are expressly incorporated by reference herein.

BACKGROUND

The present invention relates to the field of precision motion systems, and in particular, to a displacement device based on Hall-effect sensors and planar motors.

Many industrial applications require accurate positioning of objects in at least two directions that are approximately orthogonal to each other. Taking the semiconductor industry as an example, integrated circuit manufacturing requires accurate positioning of objects (such as chips or markings) in at least two directions for photoetching, inspection, cutting, packaging, and so on. Traditional technology is divided into multiple levels, each of which can only cause motion of single degree of freedom in order to produce combined motion of multiple degrees of freedom.

In recent years, in the field of photoetching equipment, a displacement device called maglev planar motor that is capable of driving with multiple degrees of freedom is used in the work table and mask table of the photoetching machine. It is based on the principle of Lorentz force and applies the produced electromagnetic force directly to the work table, thereby providing multi-axis motions. This maglev planar motor generally includes such two parts as a magnet array and a coil winding unit. The magnet array units in the magnet array are arranged in an alternate manner, which is very convenient for expansion and effectively overcomes the technical bottleneck in the design of large strokes. In addition, this displacement device not only realizes motion of six degrees of freedom, but also saves the intermediate transmission link, the structure is compact, the overall rigidity is high, with such characteristics as direct drive, no mechanical friction and no recoil, being conducive to achieving higher acceleration performance and positioning accuracy, helpful in improving the movement efficiency of the motion table, and able to attain higher positioning accuracy and motion acceleration. Besides, through the magnetic levitation technology, the constraints on the motion surface are reduced, and there is no contact wear during the working process, and this is very suitable for the needs of microelectronic equipment for large strokes, vacuum, ultra-clean, and ultra-precision positioning.

In the displacement device based on planar motors described in the patent documents 1 and 2 submitted by the present inventor, the coil array is provided on a mover, and the magnet array is provided on a stator. The mover can make, relative to the stator, long-distance movement with two degrees of freedom (translation along the direction X and translation along the direction Y) and short-distance movement with four degrees of freedom (translation along the direction Z and rotation around the directions X, Y, and Z). To realize movement of these six degrees of freedom, a real-time displacement measurement system is required, so as to provide a displacement feedback signal to the closed-loop control.

Patent Document 1: PCT/EP2016/063454
Patent Document 2: CN201680039160.4

BRIEF SUMMARY

In order to solve the above problem, the present invention discloses a displacement device based on Hall-effect sensors and planar motors. The displacement device at least comprises a planar motor stator, a planar motor mover, and a Hall-effect sensor array, a magnet array on the planar motor stator extends on a first plane substantially parallel to a direction X and a direction Y to form a working area, a coil array on the planar motor mover is configured on a second plane parallel to the first plane, the planar motor mover is movably configured adjacent to the planar motor stator along a direction Z, and an interaction between the coil array and the magnet array causes the planar motor mover to produce a displacement of at least two degrees of freedom within the working area, wherein, the direction X is approximately perpendicular to the direction Y, the direction Z is approximately perpendicular to the first plane, the magnet array is configured by first magnet blocks and second magnet blocks alternately in rows and columns, the first magnet blocks include a plurality of first magnets, each of the first magnets linearly extends along the direction X and is arranged in sequence in the direction Y, the second magnet blocks include a plurality of second magnets, each of the second magnets extends linearly along the direction Y and is arranged in sequence in the direction X, the Hall-effect sensor array is configured within the working area, is composed of a plurality of Hall-effect sensors, and is installed on the planar motor mover, a size mx of the magnet blocks of the magnet array in the direction X is not less than twice a column spacing sx of the Hall-effect sensor array, and the size my of the magnet blocks of the magnet array in the direction Y is not less than twice a row spacing sy of the Hall-effect sensor array.

In the displacement device based on Hall-effect sensors and planar motors of the present invention, preferably, a number of Hall-effect sensors in any row or column of the Hall-effect sensor array is the same.

In the displacement device based on Hall-effect sensors and planar motors of the present invention, preferably, measurement directions of the Hall-effect sensor array are all the same.

In the displacement device based on Hall-effect sensors and planar motors of the present invention, preferably, the Hall-effect sensor array at least comprises a first Hall-effect sensor array and a second Hall-effect sensor array, the number of columns of the first Hall-effect sensor array is greater than the number of rows, and measurement directions of the Hall-effect sensors in the Hall-effect sensor array are the same, the number of rows of the second Hall-effect sensor array is greater than the number of columns, and measurement directions of the Hall-effect sensors in the Hall-effect sensor array are the same.

In the displacement device based on Hall-effect sensors and planar motors of the present invention, preferably, the measurement directions of the Hall-effect sensors in each row are periodically arranged, and the measurement directions of the Hall-effect sensors in each column are also periodically arranged.

In the displacement device based on Hall-effect sensors and planar motors of the present invention, preferably, each of the Hall-effect sensors measures a magnetic field intensity in the direction X, direction Y and direction Z at the same time.

In the displacement device based on Hall-effect sensors and planar motors of the present invention, preferably, the Hall-effect sensor array is configured in a plane substantially parallel to the first plane, and is located between the first plane and the second plane.

In the displacement device based on Hall-effect sensors and planar motors of the present invention, preferably, the Hall-effect sensor array is configured in a plane substantially parallel to the first plane, and is located on a side of the coil array away from the magnet array.

In the displacement device based on Hall-effect sensors and planar motors of the present invention, preferably, the Hall-effect sensor array is configured in a third plane substantially parallel to the first plane, the third plane is adjacent to the second plane in the direction Z, and a position of the Hall-effect sensor array in the direction X or the direction Y is adjacent to the coil array.

In the displacement device based on Hall-effect sensors and planar motors of the present invention, preferably, the Hall-effect sensor array is configured in a third plane substantially parallel to the first plane, the third plane and the second plane are the same plane, and the position of the Hall-effect sensor array in the direction X or the direction Y is adjacent to the coil array.

DETAILED DESCRIPTION OF THE INVENTION

Figure 1:
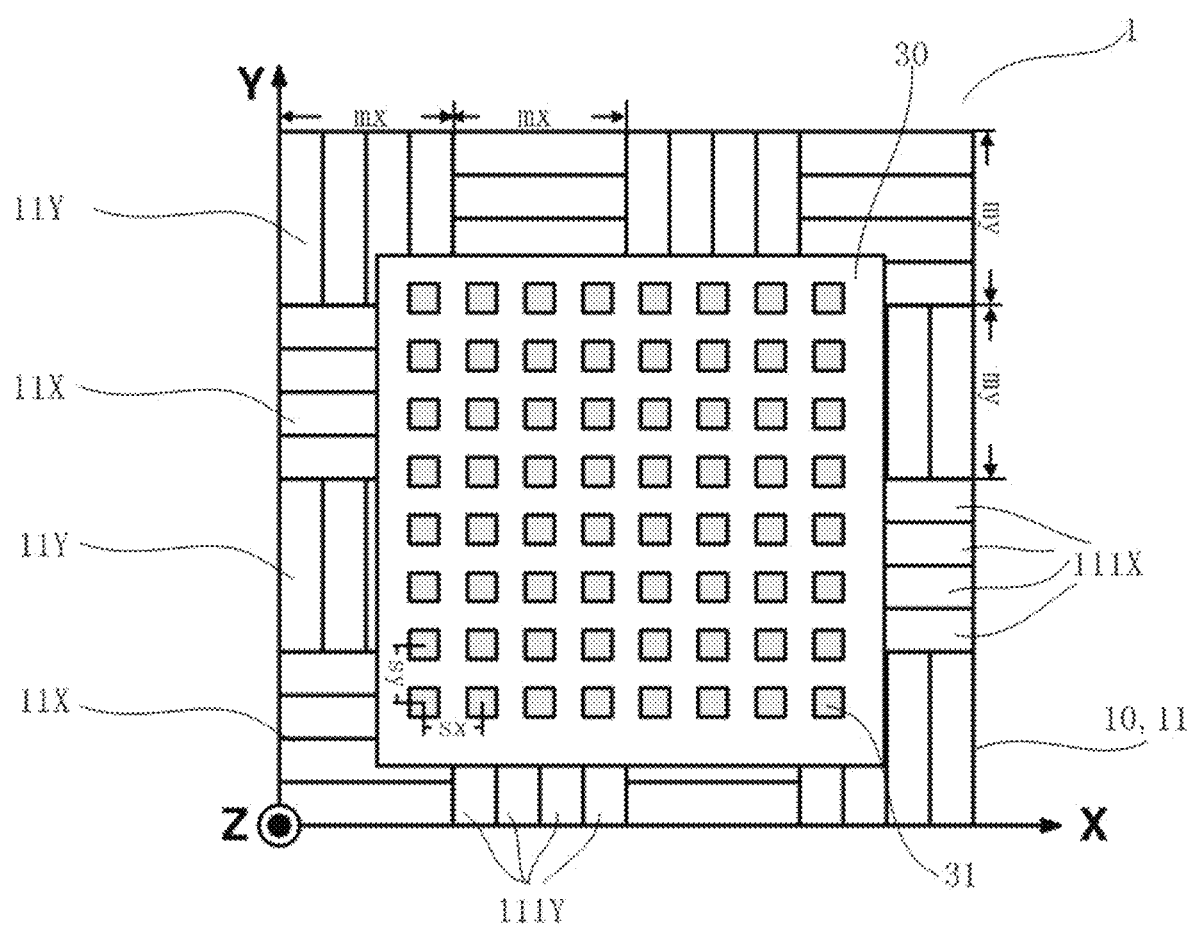
FIG. 1 is a schematic diagram of the structure of a displacement device based on Hall-effect sensors and planar motors.

In order to make the objectives, technical solutions, and advantages of the present invention clearer, the following will fully and clearly describe the technical solutions in the embodiments of the present invention with reference to the drawings in the embodiments of the present invention. It should be understood that the embodiments described here are only used to explain, not to limit, the present invention. The described embodiments are only a part of, not all, the embodiments of the present invention. Based on the embodiments of the present invention all other embodiments obtained by those having ordinary skills in the art without any creative effort involved shall fall within the protection scope of the present invention.

In the description of the present invention, it should be noted that the orientation or positional relationship indicated by the terms "upper", "lower", "vertical", "horizontal", etc. are based on the orientation or positional relationship shown in the drawings, only for the ease of description of the present invention and for simplified description, rather than indicating or suggesting that the device or element referred to must have a specific orientation, and be constructed and operated in a specific orientation, and therefore shall not be construed as limiting the present invention. In addition, such terms as "first" and "second" are only used for descriptive purposes, and shall not be understood as indicating or suggesting relative importance.

In addition, many specific details of the present invention are described below, such as the structure, material, size, processing and technology of the device, in order to understand the present invention more clearly. However, as those skilled in the art can understand, the present invention may not be implemented according to these specific details. Unless otherwise specified below, each part of the device may be composed of materials known to those skilled in the art, or materials with similar functions developed in the future.

As shown in FIG. 1, the displacement device 1 based on Hall-effect sensors and planar motors of the present invention at least comprises a planar motor stator 10, a planar motor mover 20 and a Hall-effect sensor array 30, the magnet array 11 on the planar motor stator 10 extends on a first plane (X-Y plane) substantially parallel to the direction X and the direction Y to form a working area, the coil array on the planar motor mover 20 is configured on a second plane parallel to the first plane, the planar motor mover 20 is movably configured adjacent to the planar motor stator 10 along the direction Z, and the interaction between the coil array and the magnet array causes the planar motor mover to produce a displacement of at least six degrees of freedom within the working area, including a long-distance displacement with two degrees of freedom (translation along the direction X and translation along the direction Y) and a short-distance displacement with four degrees of freedom (translation along the direction Z and rotation around the directions X, Y, and Z), wherein, the direction X is approximately perpendicular to the direction Y, the direction Z is approximately perpendicular to the first plane.

The magnet array 11 is configured by first magnet blocks 11X and second magnet blocks 11Y alternately in rows and columns, the first magnet blocks 11X include a plurality of first magnets 111X, each of the first magnets 111X linearly extends along the direction X and is arranged in sequence in the direction Y, the second magnet blocks 11Y include a plurality of second magnets 111y, each of the second magnets 111Y extends linearly along the direction Y and is arranged in sequence in the direction X. Preferably, the size mx of each magnet block in the direction X is the same as the size my in the direction Y.

The coil array (not shown in FIG. 1) includes at least three sets of three-phase coils. Each set of three-phase coils can interact with the magnet array to generate a force in the direction Z and a force perpendicular to the direction Z. The entire coil array can generate three forces in the direction Z and three forces perpendicular to the direction Z (at least two of these three forces are not parallel to each other), which are equivalent to the forces in three directions X, Y, and Z and the moments in three directions X, Y, and Z.

It should be noted here that the structure of the main body of the planar motor of the present invention adopts the structure of the displacement device disclosed by the inventor in patent documents 1 and 2, that is to say, the specific structures of the magnet array and the coil array are all included in the present invention by citing patent documents 1 and 2.

The Hall-effect sensor array 30 is configured within the working area formed by the above magnet array, is composed of a plurality of Hall-effect sensors 31, and is installed on the planar motor mover 20, each row of the magnet array 11 corresponds to at least two rows of Hall-effect sensors 31, each column of the magnet array 11 corresponds to at least two columns of Hall-effect sensors 31. That is to say, the size mx of the magnet blocks of the magnet array 11, namely the first magnet block 11X and the second magnet block 11Y, in the direction X is not less than twice the column spacing sx of the Hall-effect sensor array 30, and the size of the magnet blocks of the magnet array 11, namely the first magnet block 11X and the second magnet block 11Y, in the direction Y is not less than twice the row spacing sy of the Hall-effect sensor array 30, so as to implement real-time measurement of the displacement of the above-mentioned six degrees of freedom.

Figure 2:
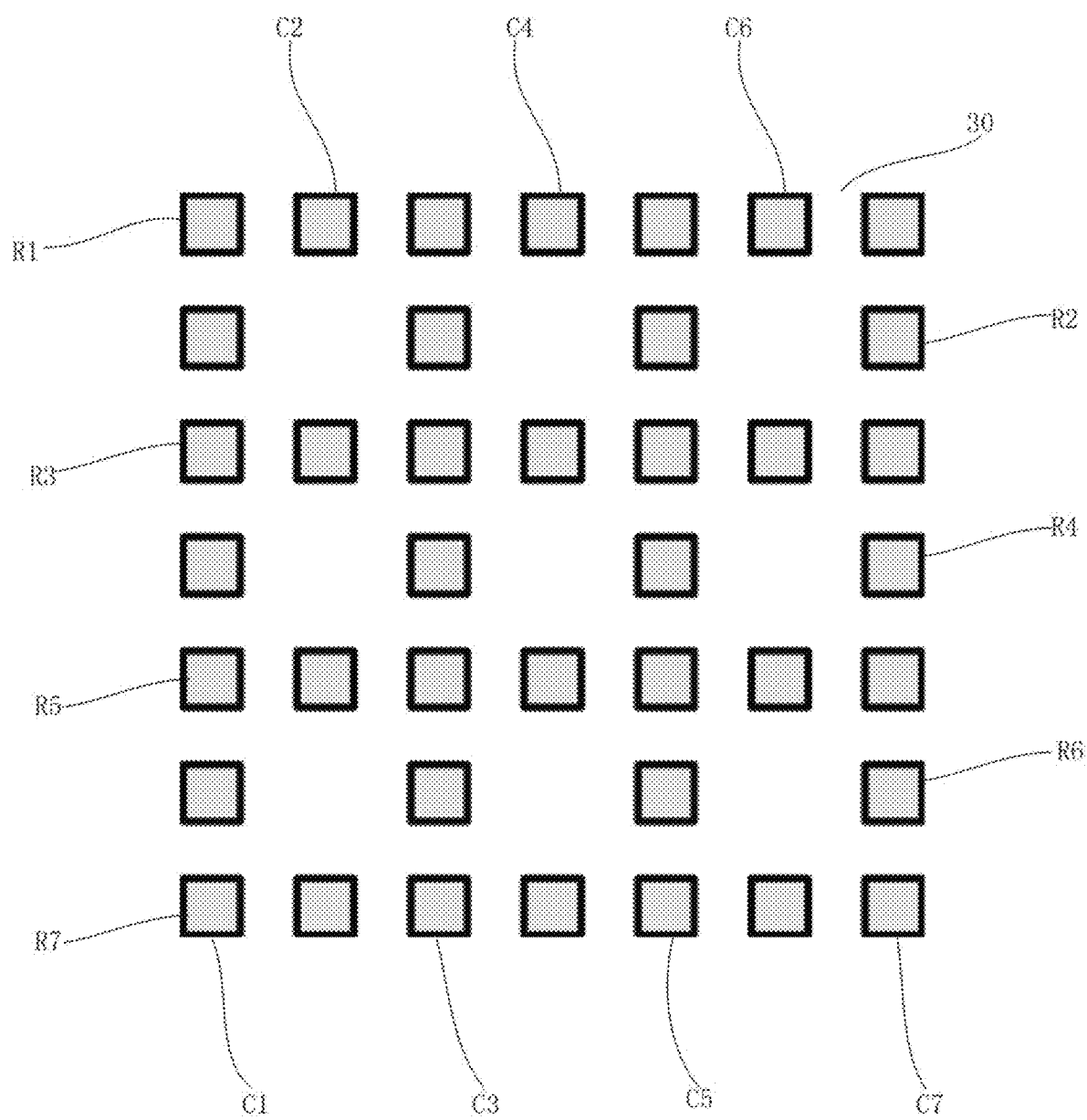
FIG. 2 is a schematic diagram of the arrangement of a Hall-effect sensor array.

The number of the Hall-effect sensors 31 in any row of the Hall-effect sensor array 30 shown in FIG. 1 is the same, and the number of Hall-effect sensors 31 in any column is also the same. However, the present invention is not limited to this, the number of sensors in each row or column of the Hall-effect sensor array may also be different. As shown in FIG. 2, each odd-numbered row R1, R3, R5, R7 of the Hall-effect sensor array has the same number of Hall-effect sensors, and each even-numbered row R2, R4, R6 has the same number of Hall-effect sensors, but the number of Hall-effect sensors in the odd-numbered row is different from that in the even-numbered row. Likewise, the number of Hall-effect sensors in any odd-numbered column C1, C3, C5, C7 is the same, and the number of Hall-effect sensors in any even-numbered column C2, C4, C6 is the same, but the number of Hall-effect sensors in the odd-numbered column is different from that in the even-numbered column. Besides, the Hall-effect sensor array can also be arranged in the following manner comprising a first Hall-effect sensor array and a second Hall-effect sensor array, the number of columns of the first Hall-effect sensor array is greater than the number of rows, and the number of rows of the second Hall-effect sensor array is greater than the number of columns.

Further preferably, the Hall-effect sensor array has the same row spacing sy and the same column spacing sx, and its size satisfies mx≥2sx; my≥2sy, to ensure that each row of magnet blocks corresponds to at least two rows of Hall-effect sensors, and each column of magnet blocks corresponds to at least two columns of Hall-effect sensors.

There are many schemes for configuring the direction in which the Hall-effect sensor array measures the magnetic field strength. For example, the measurement direction of each Hall-effect sensor array is the same, for example, all along the direction +Z. Also, the measurement directions of each row of Hall-effect sensors are arranged periodically, such as +X, +Y, +Z, +X, +Y, +Z, . . . ; or +X, +Z, +X, +Z, . . . . The measuring directions of each column of Hall-effect sensors are also arranged periodically, such as +X, +Y, +Z, +X, +Y, +Z, . . . ; or +X, +Z, +X, +Z, . . . . Alternatively, each Hall-effect sensor measures the magnetic field strength in the directions X, Y, and Z at the same time. In addition, for the above-mentioned Hall-effect sensor array configured by the first Hall-effect sensor array and the second Hall-effect sensor array, the configuration scheme for the direction of measuring the magnetic field strength can also be that each Hall-effect sensor in the first Hall-effect sensor array has the same measurement direction, for example, +X, +Y, while each Hall-effect sensor in the second Hall-effect sensor array has the same measurement direction, for example, +Z.

Figure 3:
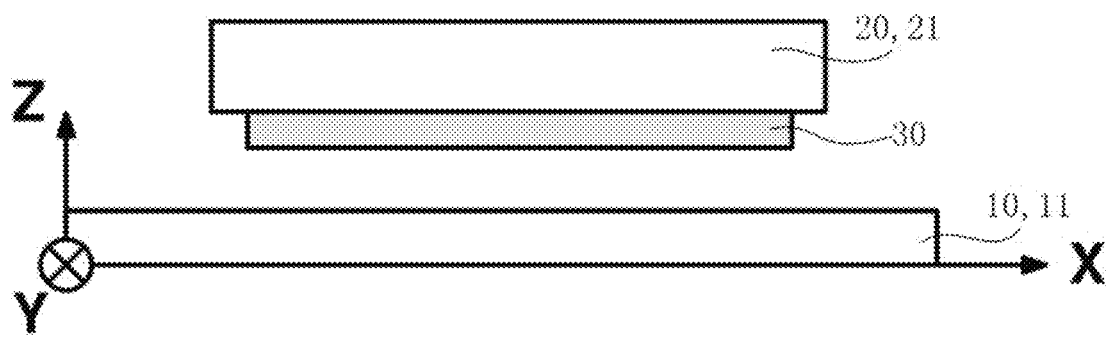
FIG. 3 is a front view of the positional arrangement of the first embodiment of the Hall-effect sensor array.

Some embodiments of the position configuration scheme of the Hall-effect sensor array:

As shown in FIG. 3, the Hall-effect sensor array 30 is configured in a plane parallel to the first plane where the magnet array 11 is located, and between the second plane where the coil array 21 is located and the first plane where the magnet array 11 is located. In this embodiment, the Hall-effect sensor array is relatively close to the magnet array, thus can help improve the accuracy of the sensor system in static or low-speed motion. At the same time, the Hall-effect sensor array does not increase the size of the mover in the direction X or Y.

Figure 4:
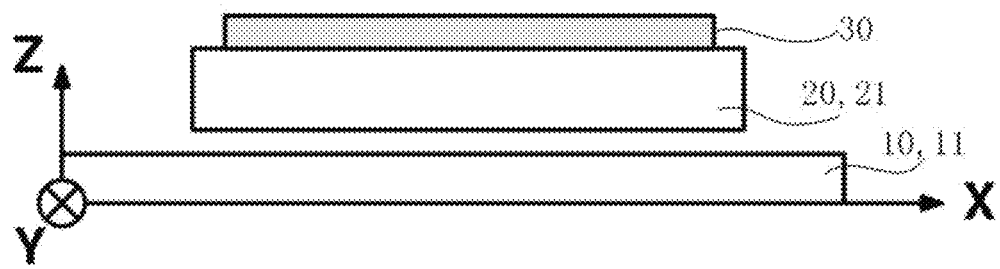
FIG. 4 is a front view of the positional arrangement of the second embodiment of the Hall-effect sensor array.

As shown in FIG. 4, the Hall-effect sensor array 30 is configured in a plane parallel to the first plane where the magnet array 11 is located, and is located on the side of the coil array 21 away from the magnet array 11. In this embodiment, the Hall-effect sensor array is relatively far away from the magnet array, the magnetic field intensity changes relatively mildly, thus can help improve the accuracy of the sensor system during high-speed motion. Besides, the Hall-effect sensor array does not increase the size of the mover in the direction X or Y.

Figure 5:
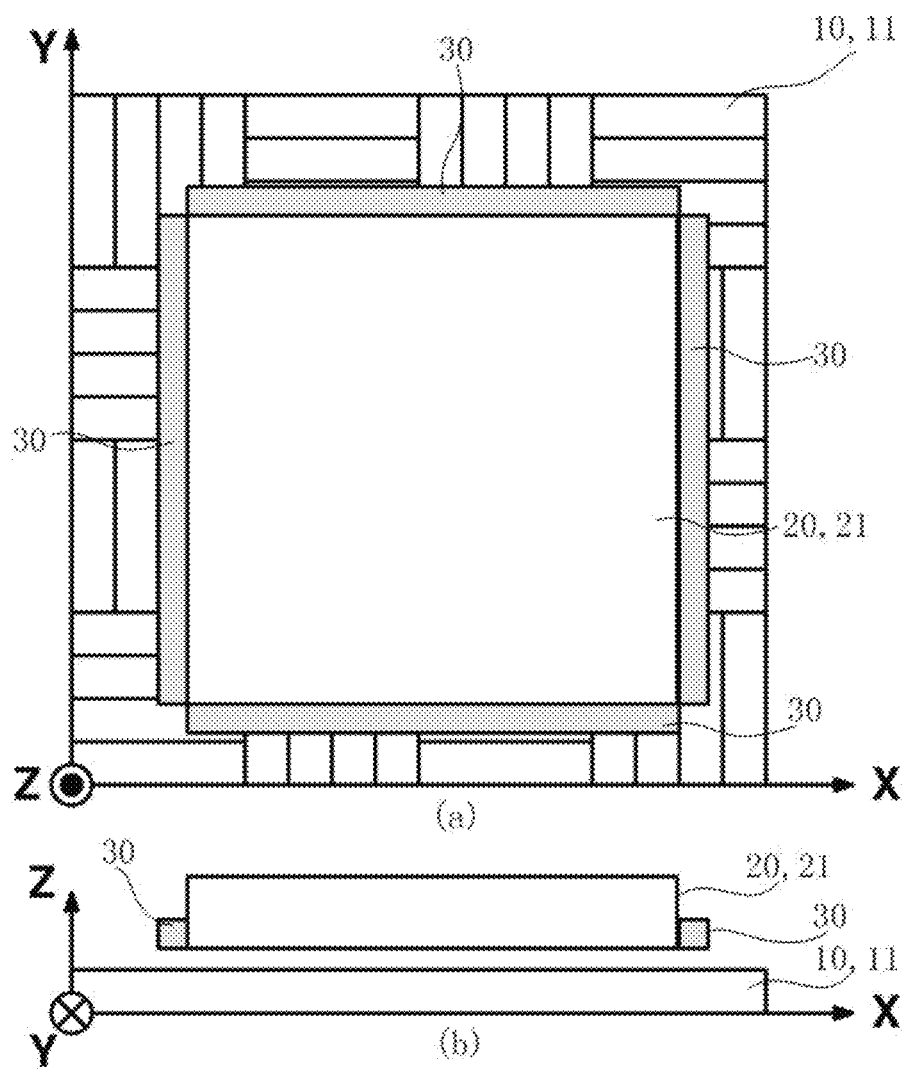
FIG. 5 is a schematic diagram of the positional arrangement of the third embodiment of the Hall-effect sensor array: (a) a top view, (b) a front view.

As shown in FIG. 5, the Hall-effect sensor array 30 is configured in a third plane parallel to the first plane where the magnet array 11 is located, and the third plane is adjacent to, in the direction Z, the second plane where the coil array 21 is located, the Hall-effect sensor array 30 is adjacent to the coil array 21 in the direction X or the direction Y. In this embodiment, the Hall-effect sensor array is relatively far from the coil array, so the accuracy will not be affected by the heat dissipation of the coil. In a variation of this embodiment, the third plane and the second plane are the same plane.

When installing the Hall-effect sensor array, all the Hall-effect sensors may be integrated on a PCB board, and a power supply unit and a signal processing unit are integrated on the PCB board. All Hall-effect sensors are connected in series. The signal of each Hall-effect sensor is converted into a digital signal through a separate analog-to-digital conversion channel and transmitted to the motion control unit.

When real-time displacement measurement is performed, the values of the magnetic field intensity generated by the planar motor stator at different locations are measured and stored in advance to form a database that corresponds the location to the magnitude of the magnetic field intensity. Then, the real-time measurement results of the Hall-effect sensor array on the planar motor mover are compared and matched with the values in the above-mentioned database, thereby calculating the current position of the planar motor mover.

The above are only specific embodiments of the present invention, but the protection scope of the present invention is not limited thereto. Any variations or substitutions that can be easily thought of by a person having ordinary skill in the art within the technical scope disclosed in the present invention shall be covered by the protection scope of the present invention.

What is claimed is:

1. A displacement device based on Hall-effect sensors and planar motors, characterized in that, the displacement device at least comprises: a planar motor stator, a planar motor mover, and a Hall-effect sensor array, a magnet array on the planar motor stator extends on a first plane substantially parallel to a direction X and a direction Y to form a working area, a coil array on the planar motor mover is configured on a second plane parallel to the first plane, the planar motor mover is movably configured adjacent to the planar motor stator along a direction Z, and an interaction between the coil array and the magnet array causes the planar motor mover to produce a displacement of at least two degrees of freedom within the working area, wherein, the direction X is approximately perpendicular to the direction Y, the direction Z is approximately perpendicular to the first plane, the magnet array is configured by first magnet blocks and second magnet blocks alternately in rows and columns, the first magnet blocks include a plurality of first magnets, each of the first magnets linearly extends along the direction X and is arranged in sequence in the direction Y, the second magnet blocks include a plurality of second magnets, each of the second magnets extends linearly along the direction Y and is arranged in sequence in the direction X, the Hall-effect sensor array is configured within the working area, is composed of a plurality of Hall-effect sensors, and is installed on the planar motor mover, a size mx of the magnet blocks of the magnet array in the direction X is not less than twice a column spacing sx of the Hall-effect sensor array, and the size my of the magnet blocks of the magnet array in the direction Y is not less than twice a row spacing sy of the Hall-effect sensor array.

2. The displacement device based on Hall-effect sensors and planar motors of claim 1, characterized in that, a number of Hall-effect sensors in any row or column of the Hall-effect sensor array is the same.

3. The displacement device based on Hall-effect sensors and planar motors of claim 1, characterized in that, measurement directions of the Hall-effect sensor array are all the same.

4. The displacement device based on Hall-effect sensors and planar motors of claim 1, characterized in that, the Hall-effect sensor array at least comprises a first Hall-effect sensor array and a second Hall-effect sensor array, a number of columns of the first Hall-effect sensor array is greater than the number of rows, and measurement directions of the Hall-effect sensors in the Hall-effect sensor array are the same; the number of rows of the second Hall-effect sensor array is greater than the number of columns, and measurement directions of the Hall-effect sensors in the Hall-effect sensor array are the same.

5. The displacement device based on Hall-effect sensors and planar motors of claim 1 characterized in that, measurement directions of the Hall-effect sensors in each row are periodically arranged, and the measurement directions of the Hall-effect sensors in each column are also periodically arranged.

6. The displacement device based on Hall-effect sensors and planar motors of claim 1 characterized in that, each of the Hall-effect sensors measures a magnetic field intensity in the direction X, direction Y and direction Z at the same time.

7. The displacement device based on Hall-effect sensors and planar motors of claim 1 characterized in that, the Hall-effect sensor array is configured in a plane substantially parallel to the first plane, and is located between the first plane and the second plane.

8. The displacement device based on Hall-effect sensors and planar motors of claim 1 characterized in that, the Hall-effect sensor array is configured in a plane substantially parallel to the first plane, and is located on a side of the coil array away from the magnet array.

9. The displacement device based on Hall-effect sensors and planar motors of claim 1 characterized in that, the Hall-effect sensor array is configured in a third plane substantially parallel to the first plane, the third plane is adjacent to the second plane in the direction Z, and a position of the Hall-effect sensor array in the direction X or the direction Y is adjacent to the coil array.

10. The displacement device based on Hall-effect sensors and planar motors of claim 1 characterized in that, the Hall-effect sensor array is configured in a third plane substantially parallel to the first plane, the third plane and the second plane are the same plane, and a position of the Hall-effect sensor array in the direction X or the direction Y is adjacent to the coil array.

* * * * *